(12) United States Patent
Chuang et al.

(10) Patent No.: US 12,426,274 B2
(45) Date of Patent: Sep. 23, 2025

(54) METHOD FOR MRAM TOP ELECTRODE CONNECTION

(71) Applicant: Taiwan Semiconductor Manufacturing Company, Ltd., Hsin-Chu (TW)

(72) Inventors: Harry-Hak-Lay Chuang, Zhubei (TW); Hung Cho Wang, Taipei (TW); Sheng-Chang Chen, Hsinchu County (TW); Sheng-Huang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/408,892

(22) Filed: Jan. 10, 2024

(65) Prior Publication Data

US 2024/0147734 A1 May 2, 2024

Related U.S. Application Data

(60) Division of application No. 17/703,065, filed on Mar. 24, 2022, now Pat. No. 11,910,619, which is a continuation of application No. 16/884,353, filed on May 27, 2020, now Pat. No. 11,322,543.

(51) Int. Cl.
*H10B 61/00* (2023.01)
*H10N 50/01* (2023.01)
*H10N 50/80* (2023.01)

(52) U.S. Cl.
CPC ............. *H10B 61/22* (2023.02); *H10N 50/01* (2023.02); *H10N 50/80* (2023.02)

(58) Field of Classification Search
CPC ........ H10B 61/22; H10N 50/80; H10N 50/01; H01L 27/228; H01L 43/02; H01L 43/12
USPC ........................................................ 257/427
See application file for complete search history.

(56) References Cited

U.S. PATENT DOCUMENTS

| | | | |
|---|---|---|---|
| 9,614,145 B2 | 4/2017 | Huang et al. | |
| 9,673,388 B2 | 6/2017 | Toh et al. | |
| 10,461,246 B2 | 10/2019 | Lu et al. | |
| 10,516,102 B1 | 12/2019 | Yang et al. | |

(Continued)

OTHER PUBLICATIONS

Shen et al. CN 115589765 A, Semiconductor Device And Forming Method Thereof (Year: 2023).*

(Continued)

*Primary Examiner* — Tu-Tu V Ho
(74) *Attorney, Agent, or Firm* — Eschweiler & Potashnik, LLC

(57) ABSTRACT

Various embodiments of the present disclosure are directed towards an integrated chip including a memory cell overlying a substrate and comprising a top electrode. A sidewall spacer structure is disposed along sidewalls of the memory cell. The sidewall spacer structure comprises a first spacer layer on the memory cell, a second spacer layer around the first spacer layer, and a third spacer layer around the second spacer layer. The second spacer layer comprises a lateral segment adjacent to a vertical segment. The lateral segment abuts the top electrode and has a top surface aligned with or disposed below a top surface of the top electrode. A first conductive structure overlies the memory cell and contacts the lateral segment and the top electrode.

20 Claims, 12 Drawing Sheets

(56) References Cited

U.S. PATENT DOCUMENTS

| | | |
|---|---|---|
| 2017/0054070 A1 | 2/2017 | Bak et al. |
| 2017/0222128 A1 | 8/2017 | Sung et al. |
| 2018/0248112 A1* | 8/2018 | Chuang ................. H10N 50/10 |
| 2019/0067559 A1 | 2/2019 | Chang et al. |
| 2019/0088863 A1 | 3/2019 | Lu et al. |
| 2020/0006638 A1 | 1/2020 | Chen et al. |
| 2020/0006641 A1* | 1/2020 | Liou ..................... H10B 61/20 |
| 2020/0098982 A1 | 3/2020 | Chuang et al. |
| 2020/0127047 A1 | 4/2020 | Chen et al. |
| 2021/0111333 A1 | 4/2021 | Chang et al. |

OTHER PUBLICATIONS

Non-Final Office Action dated Jun. 25, 2021 for U.S. Appl. No. 16/884,353.
Notice of Allowance dated Dec. 29, 2021 for U.S. Appl. No. 16/884,353.
Non-Final Office Action dated Apr. 25, 2023 for U.S. Appl. No. 17/703,065.
Notice of Allowance dated Oct. 17, 2023 for U.S. Appl. No. 17/703,065.

* cited by examiner

METHOD FOR MRAM TOP ELECTRODE CONNECTION

REFERENCE TO RELATED APPLICATIONS

This application is a Divisional of U.S. application Ser. No. 17/703,065, filed on Mar. 24, 2022, which is a Continuation of U.S. application Ser. No. 16/884,353, filed on May 27, 2020 (now U.S. Pat. No. 11,322,543, issued on May 3, 2022). The contents of the above-referenced patent applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
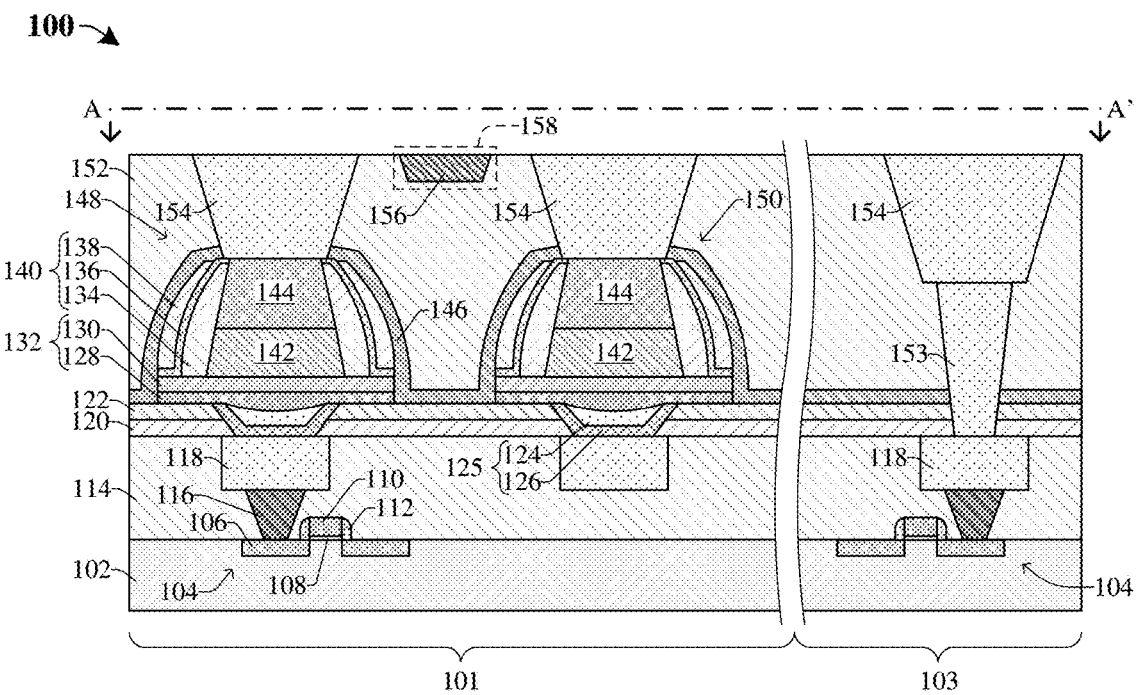
FIGS. 1A-C illustrate various views of a memory device having magnetoresistive random access memory (MRAM) cells respectively comprising a protective sidewall spacer layer laterally surrounding a magnetic tunnel junction (MTJ) and a top electrode contacting an overlying conductive wire.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A magnetoresistive random-access memory (MRAM) device comprises a magnetic tunnel junction (MTJ) vertically arranged within a back-end-of-the-line (BEOL) metal stack between a bottom electrode and a top electrode. The MTJ comprises a pinned layer and a free layer, which are vertically separated by a tunnel barrier layer. A magnetic orientation of the pinned layer is static (i.e., fixed), while a magnetic orientation of the free layer is capable of switching between a parallel configuration and an anti-parallel configuration with respect to that of the pinned layer. The parallel configuration provides for a low resistance state that digitally stores data as a first data state (e.g., a logical "0"). The anti-parallel configuration provides for a high resistance state that digitally stores data as a second data state (e.g., a logical "1").

A process for forming an MRAM device may include forming an MRAM cell over a lower interconnect wire in an embedded memory region of an integrated chip. The MRAM cell includes a top electrode, a bottom electrode, and an MTJ disposed between the top and bottom electrodes. A stack of dielectric layers are formed over the MRAM cell and over a logic region that is laterally adjacent to the embedded memory region. A first etch process is performed according to a first making layer, thereby removing at least a portion of the stack of dielectric layers within the logic region. An upper inter-level dielectric (ILD) layer is formed over the embedded memory region and the logic region. A first upper surface of the upper ILD layer in the embedded memory region is vertically offset from a second upper surface of the upper ILD layer in the logic region by a non-zero distance. A second etch process is performed according to a second masking layer, thereby significantly reducing or eliminating the vertical offset between the first and second upper surfaces of the upper ILD layer. Subsequently, a third etch process is performed according to a third masking layer to form a top electrode opening in the upper ILD layer and overlying the top electrode. A fourth etch process is performed according to a fourth masking layer to form a conductive wire opening over an interconnect wire disposed within the logic region. Additionally, a fifth etch process is performed according to the third masking layer to expand both the top electrode opening and the conductive wire opening. Finally, an upper conductive wire and a top electrode via are formed over the top electrode.

Challenges with the aforementioned method may arise during the multiple etch processes. For example, in order to expose an entire upper surface of the top electrode to facilitate a strong electrical connection between the top electrode and the top electrode via, a high power etch process with a long etching time may be employed during the fifth etch process. However, the high power etch process and/or the long etching time may over etch and expose the tunnel barrier layer within the MTJ. This in turn may lead to electrical shorting between the pinned layer and the free layer and/or damage to the tunnel barrier layer, thereby damaging the MTJ (e.g., rendering the MTJ inoperable). In another example, the etching power and/or etching time of the fifth etch process may be reduced, thereby reducing damage to the MTJ. However, this may result in a poor electrical connection and/or an open circuit between the top electrode and the top electrode via. Further, the multiple etch processes utilizing multiple masking layers increases a time and costs associated with forming the MRAM device.

The present disclosure, in some embodiments, relates to a simplified method for forming an MRAM device. For example, the method may include forming an MRAM cell over an interconnect wire disposed laterally within an embedded memory region. A protective sidewall spacer layer may be formed laterally around the MRAM cell. An upper inter-level dielectric (ILD) structure is formed over the MRAM cell and an adjacent logic region. A planarization process (e.g., a chemical mechanical planarization (CMP) process) is performed on the upper ILD structure to reduce a variation of height in the upper ILD structure between the embedded memory region and the logic region. A first masking layer is formed over the embedded memory region and the logic region. A first etch process is performed according to the first masking layer to expose an upper surface of the top electrode of the MRAM cell and an upper surface of a lower interconnect wire disposed within the logic region. The protective sidewall spacer layer is etched at a slower rate (e.g., at least five times slower) than the upper ILD structure during the first etch process. A first conductive wire is formed over the top electrode and a second conductive wire and a conductive via are formed over the lower interconnect wire within the logic region, such that the first conductive wire contacts the top electrode. Because the protective sidewall spacer layer is etched more slowly than the upper ILD structure, the top electrode via may be omitted and a strong electrical connection is made between the first conductive wire and the top electrode without over etching and damaging the MTJ. Additionally, the protective sidewall spacer layer facilies exposing the upper surface of the top electrode and the upper surface of the lower interconnect wire with a single etch and a single masking layer. This in turn facilities forming the MRAM device with fewer etch processes and fewer masking layers, thereby reducing costs and time associated with forming the MRAM device.

FIG. 1A illustrates a cross-sectional view of some embodiments of a memory device 100 having magnetoresistive random access memory (MRAM) cells 148, 150 respectively comprising a protective sidewall spacer layer 136 laterally surrounding a magnetic tunnel junction (MTJ) structure 142 and a top electrode 144 contacting an upper conductive wire 154.

The memory device 100 includes an embedded memory region 101 laterally adjacent to a logic region 103. A lower inter-level dielectric (ILD) layer 114 overlies a substrate 102. One or more semiconductor devices 104 are disposed within and/or on the substrate 102. The one or more semiconductor devices 104 may be configured as transistors and may comprise source/drain regions 106, a sidewall spacer structure 112, a gate structure 110, and a gate dielectric layer 108. A conductive contact 116 extends from a lower interconnect wire 118 to the one or more semiconductor devices 104. A first dielectric layer 120 overlies the lower ILD layer 114 and a second dielectric layer 122 overlies the first dielectric layer 120.

MRAM cells 148, 150 are spaced laterally within the embedded memory region 101 and respectively comprise a top electrode 144, a bottom electrode 132, and an MTJ structure 142 disposed between the top and bottom electrodes 144, 132. A bottom electrode via 125 extends through the first and second dielectric layers 120, 122 to electrically couple the bottom electrode 132 to the lower interconnect wire 118. The bottom electrode via 125 includes a lower metal layer 124 and a diffusion barrier layer 126. The bottom electrode 132 includes a first bottom electrode layer 128 underlying a second bottom electrode layer 130. In some embodiments, the MTJ structure 142 includes a free layer, a pinner layer, and a tunnel barrier layer disposed between the free and pinned layers. The MRAM cells 148, 150 are configured to store a data state based upon a resistive value of the MRAM cells 148, 150, respectively. For example, a first MRAM cell 148 will either store a first data state (e.g., a logical "0") if the first MRAM cell 148 has a low resistance state or a second data state (e.g., a logical "1") if the first MRAM cell 148 has a high resistance state. During operation, the MTJ structure 142 may be changed between the low resistance state and the high resistance state through the tunnel magnetoresistance (TMR) effect. An upper ILD layer 152 overlies the MRAM cells 148, 150.

A sidewall spacer structure 140 is disposed between the MTJ structure 142 and the upper ILD layer 152. The sidewall spacer structure 140 includes a first sidewall spacer layer 134, a second sidewall spacer layer 138, and the protective sidewall spacer layer 136 disposed between the first and second sidewall spacer layers 134, 138. In some embodiments, the first and second sidewall spacer layers 134, 138 may, for example, each be or comprise a first material such as silicon nitride, silicon carbide, or the like. In further embodiments, the protective sidewall spacer layer 136 may, for example, be or comprise a second material such as a metal oxide (e.g., aluminum oxide), a metal nitride (e.g., aluminum nitride), or the like. In some embodiments, the first material is different from the second material. The protective sidewall spacer layer 136 contacts a sidewall of the top electrode 144 and continuously extends along the sidewall of the top electrode 144 and along a sidewall of the MTJ structure 142 to an upper surface of the bottom electrode 132. An outer sidewall spacer layer 146 overlies the MRAM cells 148, 150 and laterally extends to a lower interconnect wire 118 disposed within the logic region 103.

Within the logic region 103, an upper conductive wire 154 and a conductive via 153 overlie the lower interconnect wire 118. The conductive via 153 is disposed between the upper conductive wire 154 and the lower interconnect wire 118. In some embodiments, within the embedded memory region 101, an upper conductive wire 154 directly contacts the top electrode 144 of the first MRAM cell 148 and the top electrode 144 of a second MRAM cell 150, respectively. In some embodiments, the upper conductive wire 154 directly contacts the protective sidewall spacer layer 136. The upper ILD layer 152 comprises sidewalls defining a trench 158 between the first and second MRAM cells 148, 150. The trench 158 may be filled with a first dielectric protection layer 156.

In some embodiments, during a method for forming the memory device 100, the protective sidewall spacer layer 136 functions as an etch stop layer in an etch process used to form openings within which the upper conductive wires 154 and conductive via 153 are located. This in turn is because, during the etch process, the protective sidewall spacer layer 136 has a slower etch rate (e.g., at least 5 times slower) than surrounding dielectric materials (e.g., the upper ILD layer 152). The etch process is performed according to a single masking layer and the openings are formed concurrently in the embedded memory region 101 and the logic region 103, thereby reducing time and costs associated with forming the memory device 100.

Figure 1B:
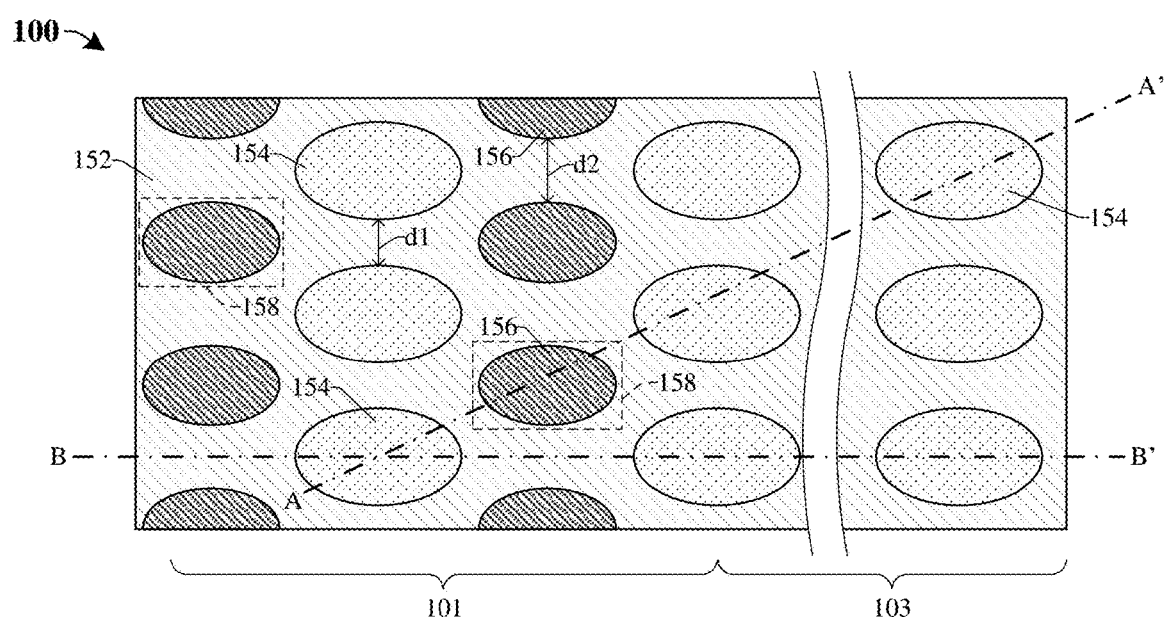

FIG. 1B illustrates a top view of alternative embodiments of the memory device 100 shown along line A-A' of the cross-sectional view of FIG. 1A.

The memory device 100 includes the embedded memory region 101 and the logic region 103 laterally adjacent to the embedded memory region 101. The embedded memory region 101 comprises an array of MRAM cells arranged in rows and columns. It will be appreciated that memory arrays can include any number of MRAM cells and thus FIG. 1B is merely an example. In some embodiments, the trench 158 is center between four adjacent upper conductive wires 154. In further embodiments, a first distance d1 is defined between two adjacent upper conductive wires 154 and a second distance d2 is defined between two adjacent trenches 158, where the two adjacent trenches 158 comprise the first dielectric protection layer 156. In some embodiments, the first distance d1 is a minimum distance between two adjacent upper conductive wires 154 and/or the second distance d2 is a minimum distance between two adjacent trenches 158. In some embodiments, the second distance d2 is, for example, about equal to the first distance d1 (e.g., about 1*d1) or within a range of about 0.5*d1 to 2*d1.

Figure 1C:
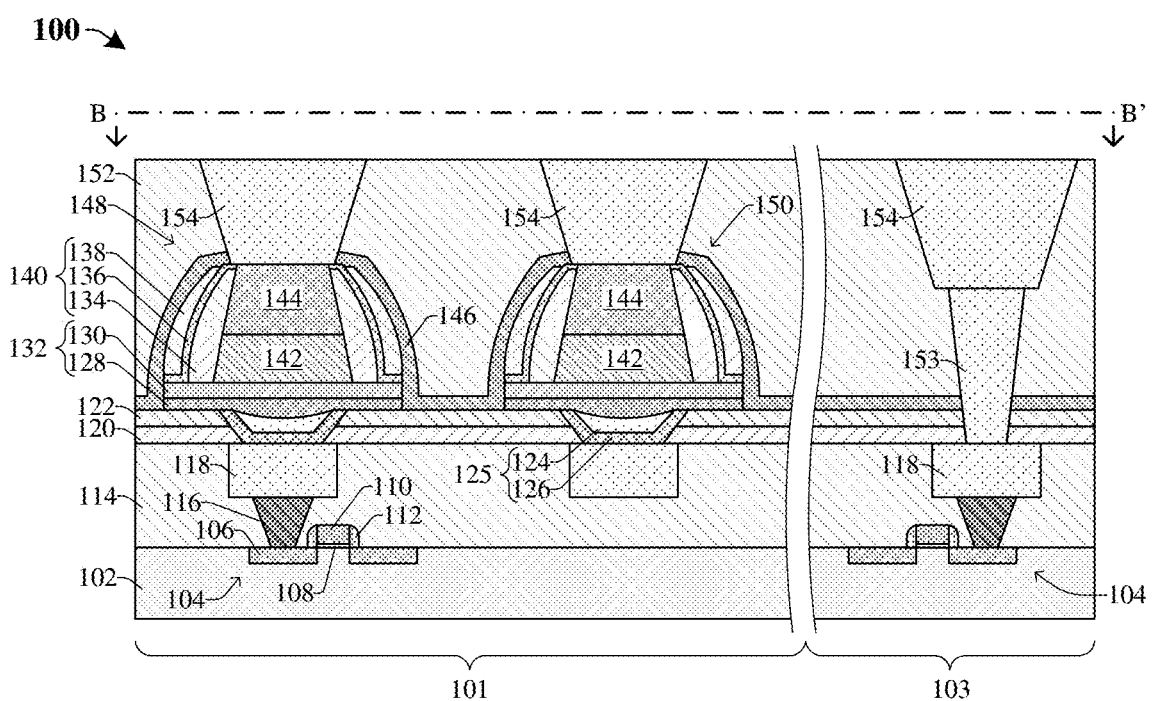

FIG. 1C illustrates a cross-sectional view of alternative embodiments of the memory device 100 shown along line B-B' of the top view of FIG. 1B, in which the first dielectric protection layer (156 of FIG. 1B) is laterally offset from the first and second MRAM cells 148, 150. Further, the first dielectric protection layer (156 of FIG. 1B) is laterally offset from the logic region 103.

Figure 2A:
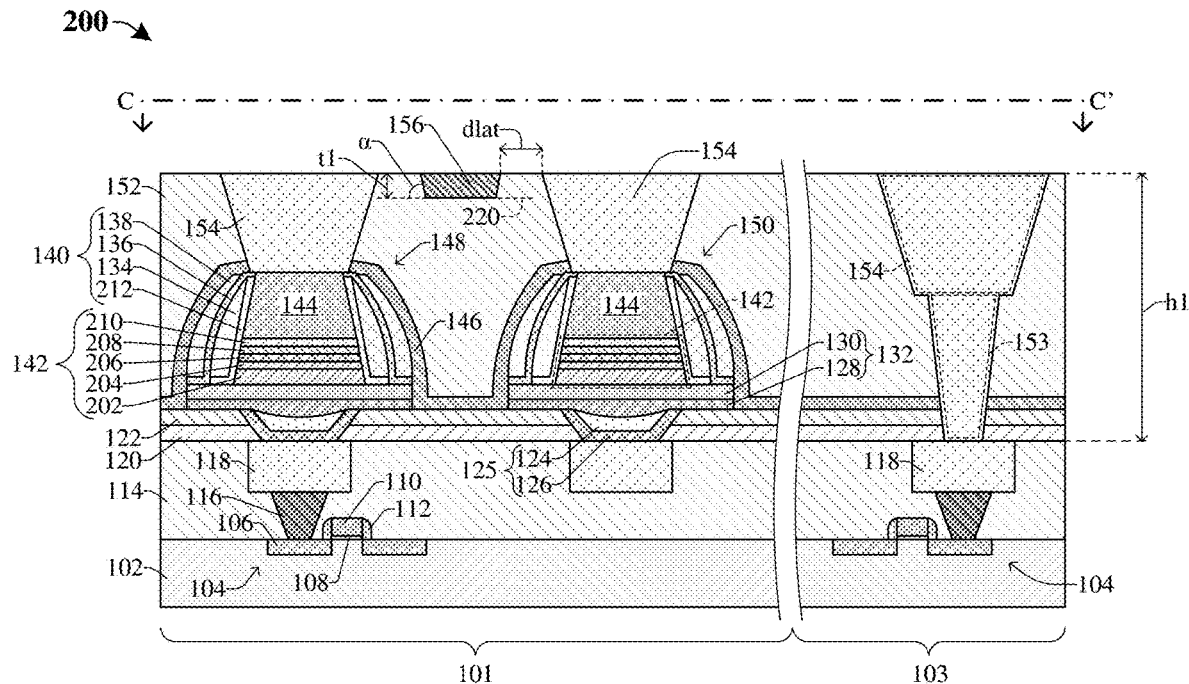
FIG. 2A illustrates a cross-sectional view of a memory device according to some alternative embodiments of the memory device of FIGS. 1A-C.

FIG. 2A illustrates a cross-sectional view of a memory device 200 according to alternative embodiments of the memory device 100 of FIGS. 1A-C.

The memory device 200 includes an embedded memory region 101 laterally adjacent to a logic region 103. A lower ILD layer 114 overlies a substrate 102. In some embodiments, the substrate 102 may, for example, be a bulk substrate (e.g., a bulk silicon substrate) or a silicon-on-insulator (SOI) substrate. In further embodiments, the lower ILD layer 114 may comprise one or more dielectric layers that may, for example, comprise a low-K dielectric material, an oxide, such as silicon dioxide, or the like. A first dielectric layer 120 overlies the lower ILD layer 114 and a second dielectric layer 122 overlies the first dielectric layer 120. In yet further embodiments, the first dielectric layer 120 may, for example, be or comprise hydrogen and nitrogen doped carbide (HNDC), silicon carbide, or the like and/or may have a thickness of about 250 Angstroms or some other suitable thickness. In some embodiments, the second dielectric layer 122 may be configured as an etch stop layer and/or may comprise silicon rich oxide, silicon nitride, or the like and/or may have a thickness of about 230 Angstroms or some other suitable thickness. A bottom electrode via 125 extends through the first and second dielectric layers 120, 122. The bottom electrode via 125 includes a lower metal layer 124 and a diffusion barrier layer 126.

A first MRAM cell 148 and a second MRAM cell 150 overlie the second dielectric layer 122 spaced laterally within the embedded memory region 101. The first and second MRAM cells 148, 150 respectively include a bottom electrode 132, a top electrode 144, and an MTJ structure 142 disposed between the top and bottom electrodes 132, 144. The bottom electrode 132 includes a first bottom electrode layer 128 and a second bottom electrode layer 130 overlying the first bottom electrode layer 128. In some embodiments, the first bottom electrode layer 128 may, for example, be or comprise tantalum, tantalum nitride, or the like and/or may have a thickness of about 100 Angstroms. In further embodiments, the second bottom electrode layer 130 may, for example be or comprise titanium, titanium nitride, or the like and/or may have a thickness of about 100 Angstroms. In yet further embodiments, the top electrode 144 may, for example, be or comprise titanium, tungsten, or the like and/or may have a thickness of about 450 Angstroms.

In some embodiments, the MTJ structure 142 may, for example, be or comprise multiple memory layers and/or may have a thickness of about 280 Angstroms or some other suitable thickness. For example, the MTJ structure 142 may include a seed layer 202, a pinned layer 204, a tunnel barrier layer 206, a free layer 208, and a capping layer 210. In some embodiments, the seed layer 202 may, for example, be or comprise tantalum, ruthenium, tantalum nitride, or the like and/or may have a thickness of about 20 Angstroms or some other suitable thickness. In some embodiments, the pinned layer 204 may, for example, be or comprise iron, cobalt, nickel, iron cobalt, a combination of the foregoing, or the like. In further embodiments, the tunnel barrier layer 206 may, for example, be or comprise magnesium oxide (MgO), aluminum oxide (e.g., $Al_2O_3$), nickel oxide, or the like. In yet further embodiments, the free layer 208 may, for example, be or comprise iron, cobalt, nickel, iron boride, iron platinum, a combination of the foregoing, or the like. In some embodiments, the capping layer 210 may, for example, be or comprise ruthenium, magnesium oxide, or the like and/or may have a thickness of about 30 Angstroms or some other suitable thickness.

In some embodiments, the pinned layer 204 can have a fixed or a "pinned" magnetic orientation that points in a first direction. The free layer 208 can have a variable or a "free" magnetic orientation, which can bet switched between two or more distinct magnetic polarities that each represents a different data state, such as a different binary state. In some embodiments, if the magnetization directions of the pinned layer 204 and the free layer 208 are in a parallel orientation, it is more likely that charge carriers (e.g., electrons) will tunnel through the tunnel barrier layer 206, such that the MTJ structure 142 is in a low-resistance state. Conversely, in some embodiments, if the magnetization directions of the pinned layer 204 and the free layer 208 are in an anti-parallel orientation, it is less likely that charge carriers (e.g., electrons) will tunnel through the tunnel barrier layer 206, such that the MTJ structure 142 is in a high-resistance state. Under normal operating conditions, the MTJ structure 142 may switch between the low-resistance state and the high-resistance state based upon a bias applied between the top electrode 144 and the bottom electrode 132.

A sidewall spacer structure 140 may continuously surround opposing sidewalls of the top electrode 144 and opposing sidewalls of the MTJ structure 142. In some embodiments, the opposing sidewalls of the MTJ structure 142 and/or the opposing sidewalls of the top electrode 144 are defined from a cross-sectional view. For example, if when viewed from above the first and/or the second MRAM cells 148, 150 are respectively circular/elliptical then the opposing sidewalls of the MTJ structure 142 are a single continuous sidewall when viewed from above, therefore the opposing "sidewalls" of the MTJ structure 142 refers to the nature of this single continuous sidewall when depicted in a cross-sectional view.

The sidewall spacer structure 140 includes an inner sidewall spacer layer 212, a first sidewall spacer layer 134, a second sidewall spacer layer 138, and a protective sidewall spacer layer 136 disposed between the first and second sidewall spacer layers 134, 138. In some embodiments, the inner sidewall spacer layer 212, the first sidewall spacer layer 134, and/or the second sidewall spacer layer 138 may respectively, for example, be or comprise silicon nitride, silicon carbide, silicon oxynitride, or the like. In some embodiments, the protective sidewall spacer layer 136 may, for example, be or comprise aluminum oxide (e.g., $Al_2O_3$), aluminum nitride, or the like and/or may have a thickness of about 30 Angstroms. An outer sidewall spacer layer 146 overlie the first and second MRAM cells 148, 150 and laterally extend to the logic region 103. In some embodiments, the outer sidewall spacer layer 146 may, for example, be or comprise silicon nitride, silicon carbide, or the like and/or may be formed by a plasma enhanced atomic layer deposition (PEALD) process. An upper ILD layer 152 overlies the first and second MRAM cells 148, 150. In some embodiments, the upper ILD layer 152 may, for example, be or comprise silicon dioxide, a low-K dielectric material, or the like and/or may have a thickness of about 1,625 Angstroms or within a range of about 1,500 to 1,750 Angstroms.

Upper conductive wires 154 and a conductive via 153 are disposed within the upper ILD layer 152. The upper conductive wires 154 and/or the conductive via 153 may respectively, for example, be or comprise copper, aluminum, titanium, tantalum, a combination of the foregoing, or the like. In some embodiments, an upper conductive wire 154 may directly contact an upper surface of the top electrode 144 and/or the upper conductive wire 154 may directly contact an upper surface of the protective sidewall spacer layer 136. In further embodiments, due to a material and/or a layout of the protective sidewall spacer layer 136, a top electrode via (not shown) may be omitted between the top electrode 144 and the upper conductive wire 154, such that the upper conductive wire 154 directly contacts the top electrode 144. This in turn reduces costs and time associated with forming the memory device 200. In some embodiments, the upper conductive wire 154 and the conductive via 153 within the logic region 103 may be a continuous conductive body that comprises a same material.

A height h1 is defined between an upper surface of the lower ILD layer 114 and the upper surface of the upper ILD layer 152. In some embodiments, the height h1 is about 2,000 Angstroms or within a range of about 1,500 to 2,500 Angstroms. In further embodiments, if the height h1 is less than about 1,500 Angstroms, then electrical connections between the MRAM cells 148, 150 and adjacent conductive layers or structures may be negatively affected. For example, the adjacent conductive layers or structures may be electrically shorted together, thereby rendering MRAM cells within the embedded memory region 101 inoperable. In yet further embodiments, if the height h1 is greater than about 2,500 Angstroms, then a number of devices that may be disposed over the substrate 102 may be reduced, thereby decreasing a performance of the memory device 200.

A first dielectric protection layer 156 is disposed within a trench 158 of the upper ILD layer 152. The first dielectric protection layer 156 is disposed laterally between the first and second MRAM cells 148, 150. In some embodiments, the first dielectric protection layer 156 is configured to protect the upper ILD layer 152 during a planarization process (e.g., a CMP process). In some embodiments, a thickness t1 of the first dielectric protection layer 156 is about 8 nanometers or within a range of about 2 to 15 nanometers. In further embodiments, if the thickness t1 is less than about 2 nanometers, then the first dielectric protection layer 156 may be unable to prevent damage to the upper ILD layer 152 during the planarization process. In yet further embodiments, if the thickness t1 is greater than about 15 nanometers, then the planarization process may be unable to expose an upper surface of the upper ILD layer 152. This in turn may lead to issues during formation of the upper conductive wire 154 and/or the conductive via 153.

In some embodiments, an angle α is defined between a sidewall of the upper ILD layer 152 and a straight horizontal line 220. In some embodiments, the straight horizontal line 220 is parallel with a top surface of the substrate 102. In some embodiments, the angle α is about 35 degrees or within a range of about 10 to 85 degrees. In some embodiments, if the angle α is less than about 10 degrees, then a duration of the planarization process may be increased to expose an upper surface of the upper ILD layer 152. In such embodiments, the increased duration of the planarization process may result in a substantial reduction of the height h1 (e.g., reduces the height h1 to less than 1,500). In further embodiments, if the angle α is greater than about 85 degrees, then the first dielectric protection layer 156 may be unable to prevent damage to the upper ILD layer 152 during the planarization process.

The upper conductive wire 154 is laterally spaced from the upper ILD layer 152 by a distance dlat. In some embodiments, the distance dlat is about 65 nanometers or within a range of about 20 to 130 nanometers. In some embodiments the distance dlat is a minimum lateral distance between the upper conductive wire 154 and the upper ILD layer 152. In further embodiments, if the distance dlat is less than 20 nanometers then the first and second MRAM cells 148, 150 may be too close together, such that conductive layers between the first and second MRAM cells 148, 150 may be shorted together, thereby rendering MRAM cells within the memory device 200 inoperable. In yet further embodiments, if the distance dlat is greater than 130 nanometers, then a number of MRAM cells that may be disposed within the embedded memory region 101 is significantly reduced, thereby reducing a performance of the memory device 200.

Figure 2B:
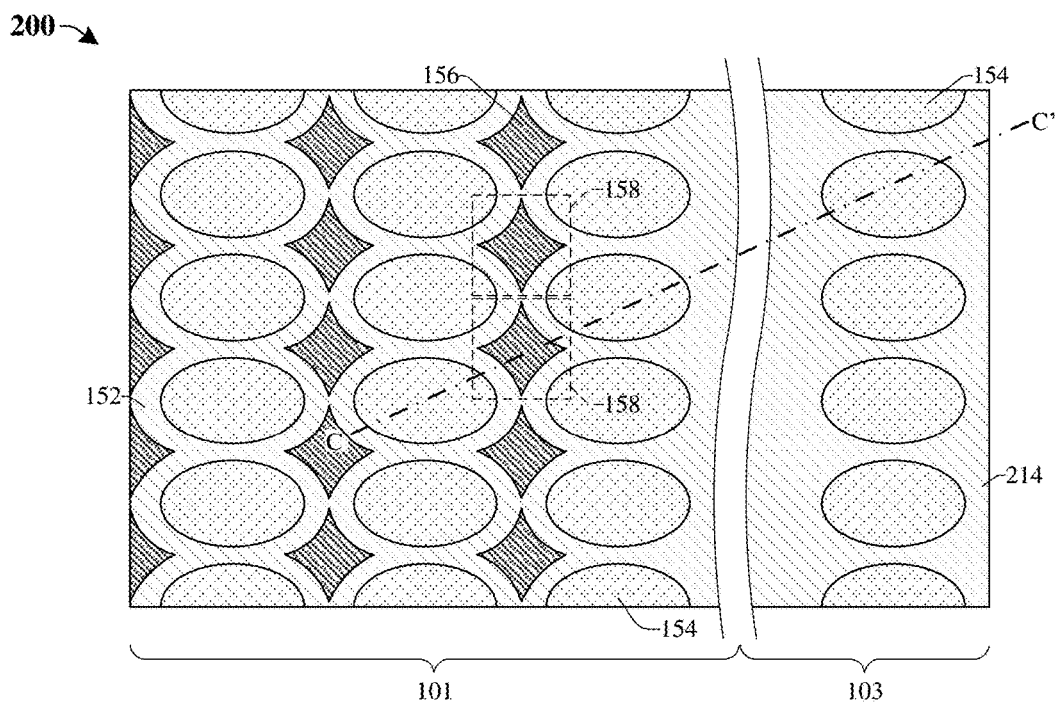
FIG. 2B illustrates a top view of some embodiments of the memory device of FIG. 2A.

FIG. 2B illustrates a top view of some alternative embodiments of the memory device 200 of FIG. 2A taken along the line C-C', in which the sidewalls of the upper ILD layer 152 that define the trench 158 are diamond shaped when viewed from above. In some embodiments, the sidewalls of the upper ILD layer 152 that define the trench 158 may, for example, be circular, elliptical, rectangular, or another suitable shape.

Figure 3A:
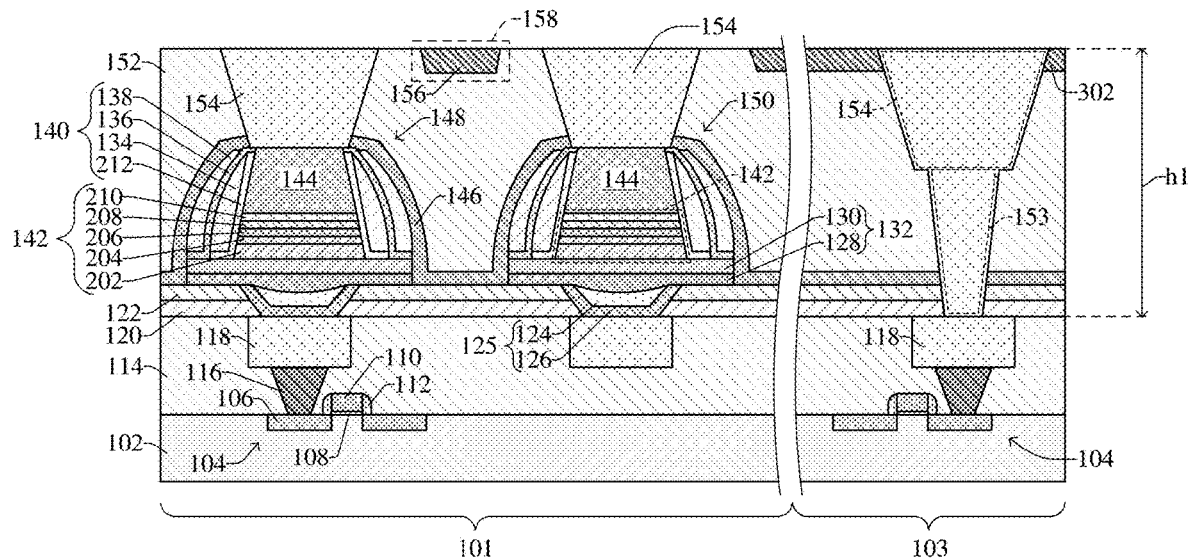
FIGS. 3A-B and 4 illustrate cross-sectional views of some alternative embodiments of the memory device of FIGS. 1A-C.

FIG. 3A illustrates a cross-sectional view of a memory device 300a according to some alternative embodiments of the memory device 100 of FIGS. 1A-C.

In some embodiments, a first dielectric protection layer 156 is disposed within the trench 158 within the embedded memory region 101 and a second dielectric protection layer 302 is disposed within the logic region 103. In further embodiments, the second dielectric protection layer 302 may laterally extend from the logic region 103 to the embedded memory region 101. In further embodiments, the first and second dielectric protection layers 156, 302 may respectively, for example, be or comprise an extreme low-K dielectric material, silicon nitride, silicon carbide, another suitable dielectric material, or the like. In further embodiments, a thickness of the first dielectric protection layer 156 may be greater than a thickness of the second dielectric protection layer 302. In yet further embodiments, the first dielectric protection layer 156 may have a thickness of about 8 nanometers or within a range of about 2 to 15 nanometers and/or the second dielectric protection layer 302 may have a thickness of about 5 Angstroms or within a range of about 0 to 50 Angstroms. In some embodiments, the second dielectric protection layer 302 may be removed from the logic region 103 and/or the thickness of the second dielectric protection layer 302 may be significantly small (e.g., within a range of 0-5 Angstroms) due to a duration of a planarization process performed on the upper ILD layer 152. In such embodiments, the second dielectric protection layer 302 is configured to mitigate and/or prevent damage to the upper ILD layer 152 disposed within the logic region 103 during the planarization process.

Figure 3B:
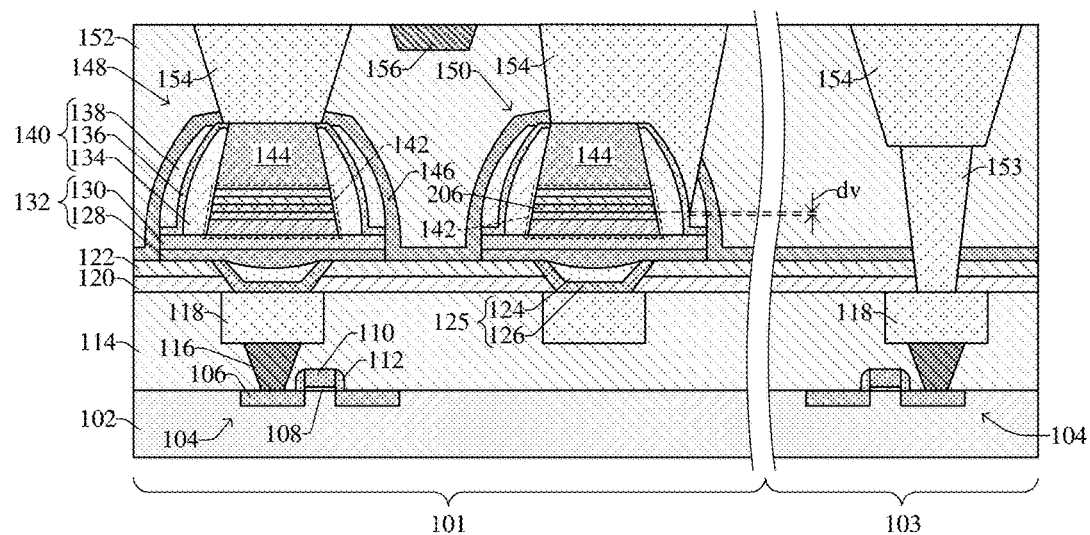

FIG. 3B illustrates a cross-sectional view of a memory device 300b according to some alternative embodiments of the memory device 100 of FIGS. 1A-C.

In some embodiments, a lower surface of the upper conductive wire 154 overlying the second MRAM cell 150 extends laterally beneath a lower surface of the tunnel barrier layer 206 by a distance dv. In some embodiments, the distance dv is non-zero. In further embodiments, a center of the upper conductive wire 154 overlying the second MRAM cell 150 may be laterally offset from a center of the top electrode 144 by a non-zero distance. This may be due to a misalignment of a masking layer utilized in forming the upper conductive wire 154. In such embodiments, a material and/or a layout of the protective sidewall spacer layer 136 prevents exposing sidewalls of the MTJ structure 142 during an etch process utilized to form an opening in the upper ILD layer 152 in which the upper conductive wire 154 exists. This in turn prevents a shorting of layers within the MTJ structure 142, thereby increasing a stability, performance, and/or endurance of the second MRAM cell 150.

Figure 4:
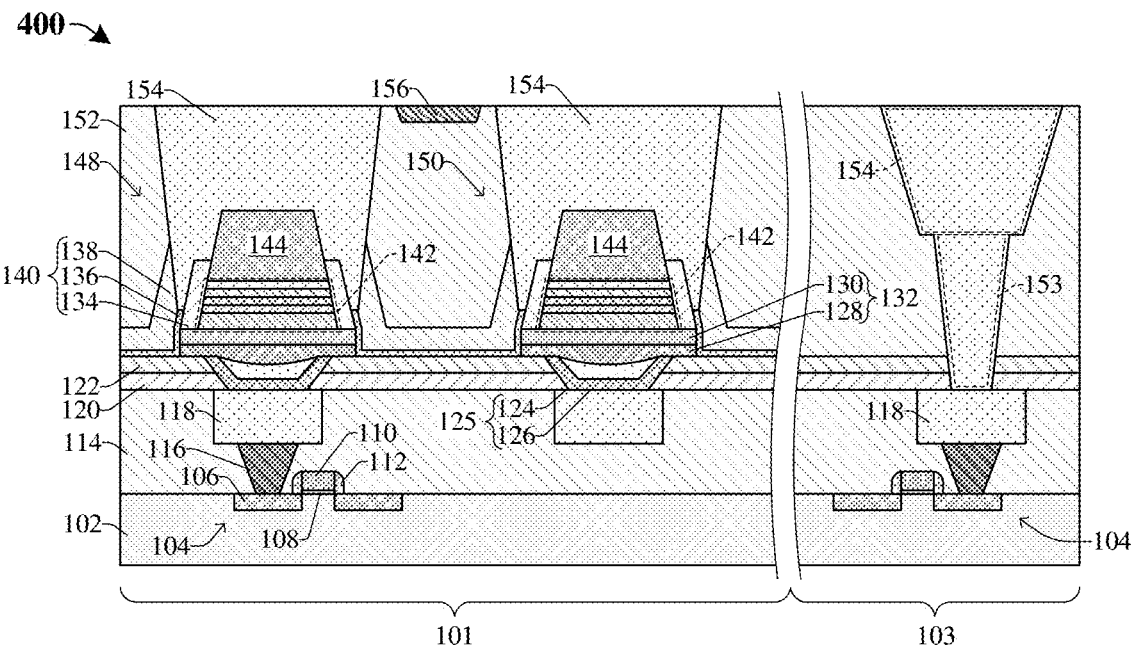

FIG. 4 illustrates a cross-sectional view of a memory device 400 according to some alternative embodiments of the memory device 100 of FIGS. 1A-C.

In some embodiments, the upper conductive wire 154 continuously extends from an upper surface of the top electrode 144 along an upper surface and sidewall of the first sidewall spacer layer 134 to an upper surface of the protective sidewall spacer layer 136.

Figure 5:
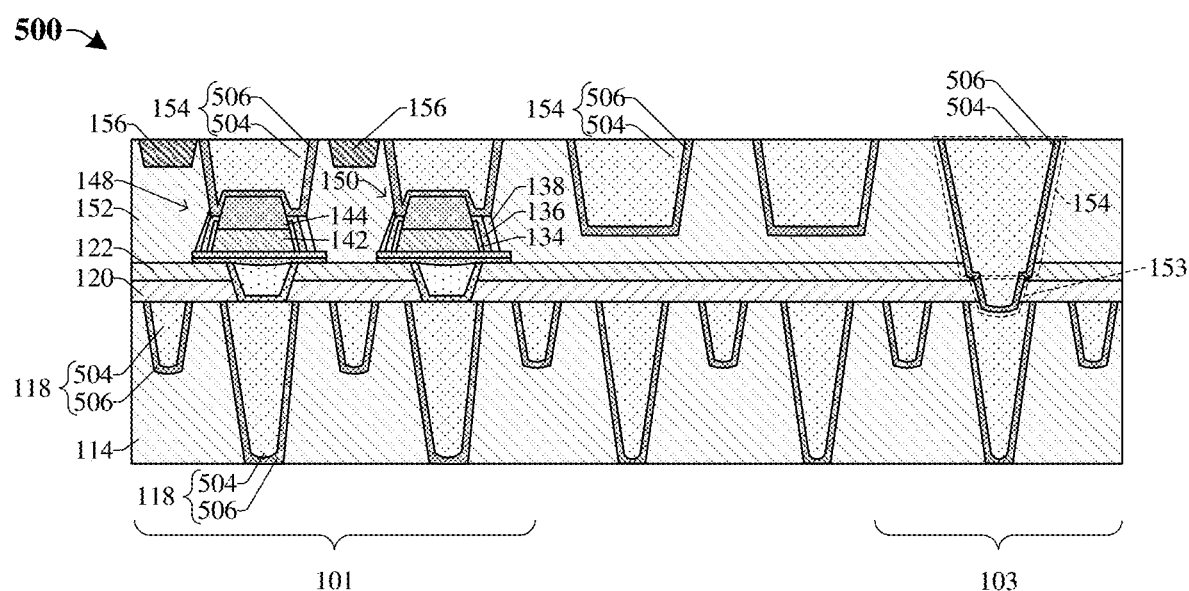
FIG. 5 illustrates a cross-sectional view of some embodiments of a memory device having an embedded memory region with MRAM cells laterally adjacent to a logic region.

FIG. 5 illustrates some embodiments of a cross-sectional view of a memory device 500 having an embedded memory region 101 laterally adjacent to a logic region 103.

As illustrated in FIG. 5, the upper conductive wires 154, the conductive via 153, and/or the lower interconnect wires 118 are respectively comprised of a conductive body 504 surrounded by a conductive liner 506. In some embodiments, the conductive body 504 may, for example, be or comprise aluminum, copper, an alloy of the aforementioned, or the like. In further embodiments, the conductive liner 506 may, for example, be or comprise tungsten, titanium, or the like.

FIGS. 6-16 illustrate various views 600-1600 of some embodiments of a method of forming a memory device having MRAM cells respectively comprising a protective sidewall spacer layer laterally surrounding an MTJ and a top electrode contacting an overlying conductive wire. Although the various views 600-1600 shown in FIGS. 6-16 are described with reference to a method, it will be appreciated that the structures shown in FIGS. 6-16 are not limited to the method but rather may stand alone separate of the method. Furthermore, although FIGS. 6-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
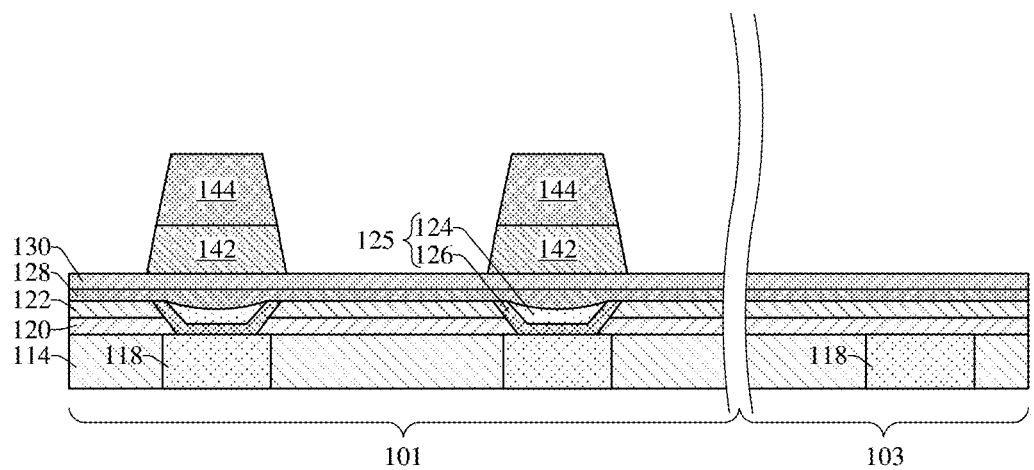
FIGS. 6-16 illustrate various views of some embodiments of a method of forming a memory device having MRAM cells respectively comprising a protective sidewall spacer layer laterally surrounding an MTJ and a top electrode contacting an overlying conductive wire.

As shown in cross-sectional view 600 of FIG. 6, a lower inter-level dielectric (ILD) layer 114 is formed over a substrate (not shown). Lower interconnect wires 118 are formed in an embedded memory region 101 and a logic region 103. In some embodiments, the lower interconnect wires 118 may, for example, be or comprise copper, aluminum, tungsten, a combination of the foregoing, or the like. A first dielectric layer 120 is formed over the lower ILD layer 114 and a second dielectric layer 122 is formed over the first dielectric layer 120. In some embodiments, the first and/or second dielectric layers 120, 122 may each be formed by performing a deposition process, such as, physical vapor deposition (PVD), chemical vapor deposition (CVD), atomic layer deposition (ALD), or another suitable deposition process. After the first deposition process the first and second dielectric layers 120, 122 are selectively patterned to define a bottom electrode via opening extending through the first and second dielectric layers 120, 122 to an underlying lower interconnect wire 118 in the embedded memory region 101.

In further embodiments, a bottom electrode via 125 is formed within the bottom electrode via opening and contacts the lower interconnect wire 118. In some embodiments, a process for forming the bottom electrode via 125 may include forming a diffusion barrier layer 126 within the bottom electrode via opening. The diffusion barrier layer 126 may be configured to prevent diffusion between adjacent layers. In yet further embodiments, the diffusion barrier layer 126 may be configured as a conductive liner and/or may comprise a glue layer configured to increase adhesion between adjacent layers. A lower metal layer 124 is formed over the diffusion barrier layer 126 within the bottom electrode via opening. In some embodiments, the diffusion barrier layer 126 and/or the lower metal layer 124 may, for example, be deposited by CVD, PVD, sputtering, electroless plating, or another suitable growth or deposition process. A planarization process (e.g., a chemical mechanical planarization (CMP) process) may subsequently be performed.

Also illustrated in FIG. 6, a first bottom electrode layer 128 is formed over the second dielectric layer 122 and the bottom electrode via 125. Further, a second bottom electrode layer 130 is formed over the first bottom electrode layer 128. In some embodiments, the first and/or second bottom electrode layers 128, 130 may each be formed by, for example, CVD, PVD, sputtering, or another suitable deposition or growth process. After forming the first and second bottom electrode layers 128, 130, a top electrode 144 and an MTJ structure 142 are formed over the second bottom electrode layer 130. In some embodiments, a process for forming the top electrode 144 and the MTJ structure 142 may include: forming a memory stack over the second bottom electrode layer 130, where the memory stack includes one or more layers for the MTJ structure 142 and one or more layers for the top electrode 144; and one or more etch processes are performed on the memory stack to define the top electrode 144 and the MTJ structure 142. In some embodiments, the one or more etch processes may be performed according to a masking layer (not shown).

Figure 7:
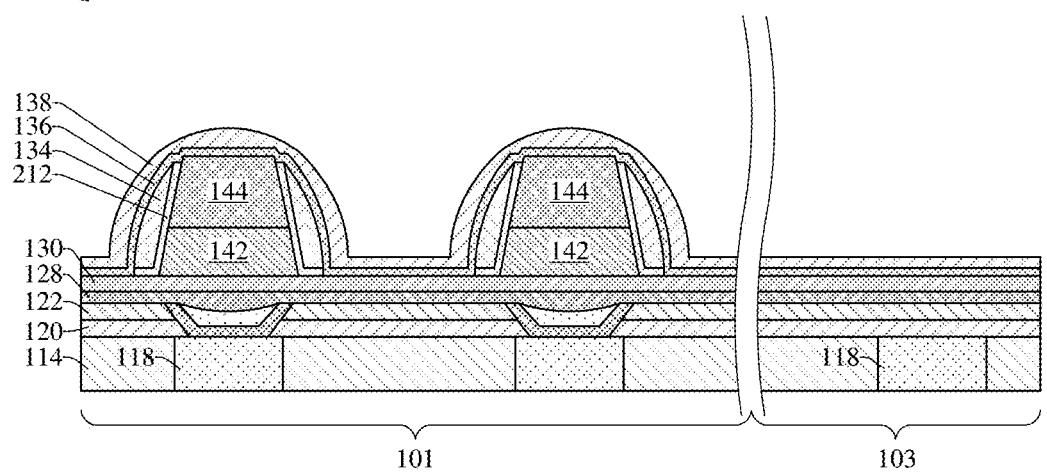

As shown in cross-sectional view 700 of FIG. 7, an inner sidewall spacer layer 212 is formed along a sidewall of the top electrode 144 and along a sidewall of the MTJ structure 142. A first sidewall spacer layer 134 is formed along a sidewall of the inner sidewall spacer layer 212. A protective sidewall spacer layer 136 is formed over the first sidewall spacer layer 134 and the top electrode 144. A second sidewall spacer layer 138 is formed over the protective sidewall spacer layer 136. In some embodiments, the inner sidewall spacer layer 212, the first sidewall spacer layer 134, the protective sidewall spacer layer 136, and/or the second sidewall spacer layer 138 may respectively be deposited by, for example, PVD, CVD, ALD, or another suitable deposition process. In some embodiments, the protective sidewall spacer layer 136 may, for example, be or comprise a metal oxide, such as aluminum oxide (e.g., $AlO_x$, where x is a positive whole number), or the like and/or may be formed to a thickness of about 30 Angstroms or within a range of about 20 to 50 Angstroms. In further embodiments, the protective sidewall spacer layer 136 may, for example, be or comprise a metal nitride, such as aluminum nitride, or the like and/or may be formed to a thickness within a range of about 40 to 100 Angstroms. Other thicknesses and/or materials is/are, however, amenable for the protective sidewall spacer layer 136.

Figure 8:
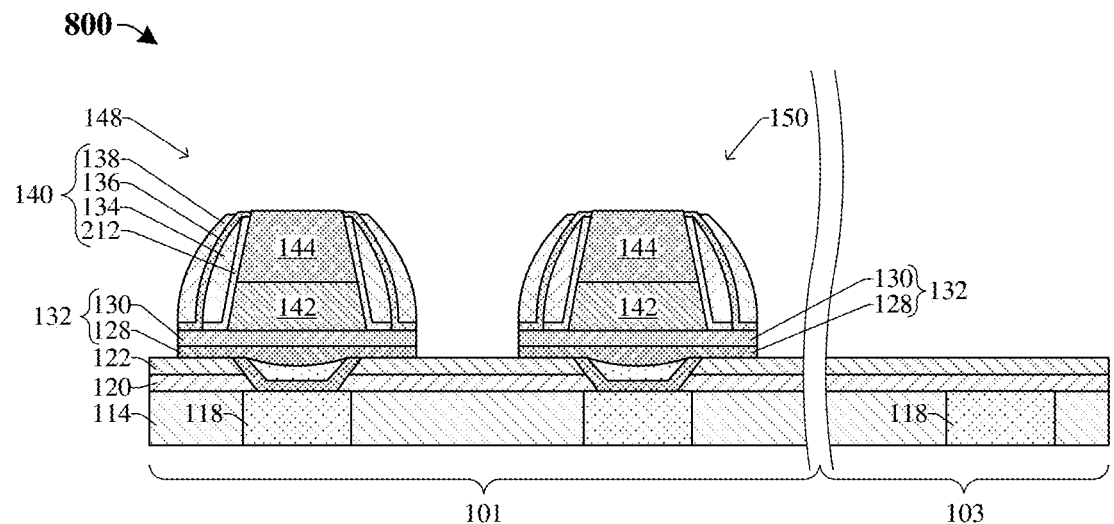

As shown in cross-sectional view 800 of FIG. 8, a patterning process is performed on the structure of FIG. 7, thereby defining bottom electrodes 132, first and second MRAM cells 148, 150, and sidewall spacer structures 140. In some embodiments, the patterning process may include, for example, performing a wet etch, a dry etch, a blanket etch, a combination or the foregoing, or the like.

In some embodiments, the bottom electrode 132 includes the first and second bottom electrode layers 128, 130. The sidewall spacer structure 140 may include the inner sidewall spacer layer 212, the first and second sidewall spacer layers 134, 138, and the protective sidewall spacer layer 136. The first and second MRAM cells 148, 150 respectively include the bottom electrode 132, the top electrode 144, and the MTJ structure 142. In some embodiments, the patterning process defines and exposes an upper surface of the top electrode 144. Further, the patterning process removes a portion of the protective sidewall spacer layer 136 above the upper surface of the top electrode 144.

In some embodiments, the patterning process may include performing a dry etch process until an upper surface of the second dielectric layer 122 is reached. In some embodiments, the dry etch process may include using one or more etchants, such as chlorine-based etchants. For example, the chlorine-based etchants may, for example, be or comprise boron chloride (e.g, $BCl_3$), chloride gas ($Cl_2$), a combination of the forgoing, or the like. In some embodiments, the dry etch process may selectively-etch the second sidewall spacer layer 138, the first bottom electrode layer 128, and/or the second bottom electrode layer 130 at first etching rate(s), and may selectively-etch the protective sidewall spacer layer 136 at a second etching rate, where the second etching rate is less than the first etching rate. For example, in some embodiments, the first etching rate may be at least 5 times greater than the second etching rate. Thus, the etch process utilized to form the bottom electrode 132 and/or the first and second MRAM cells 148, 150 has a low selectivity for the protective sidewall spacer layer 136 relative to adjacent layers (e.g., the second sidewall spacer layer 138, the first bottom electrode layer 128, and/or the second bottom electrode layer 130). This, in part, facilities formation of the first and second MRAM cells 148, 150 and the bottom electrode 132 while preventing damage to the protective sidewall spacer layer 136 and/or the MTJ structure 142.

Figure 9:
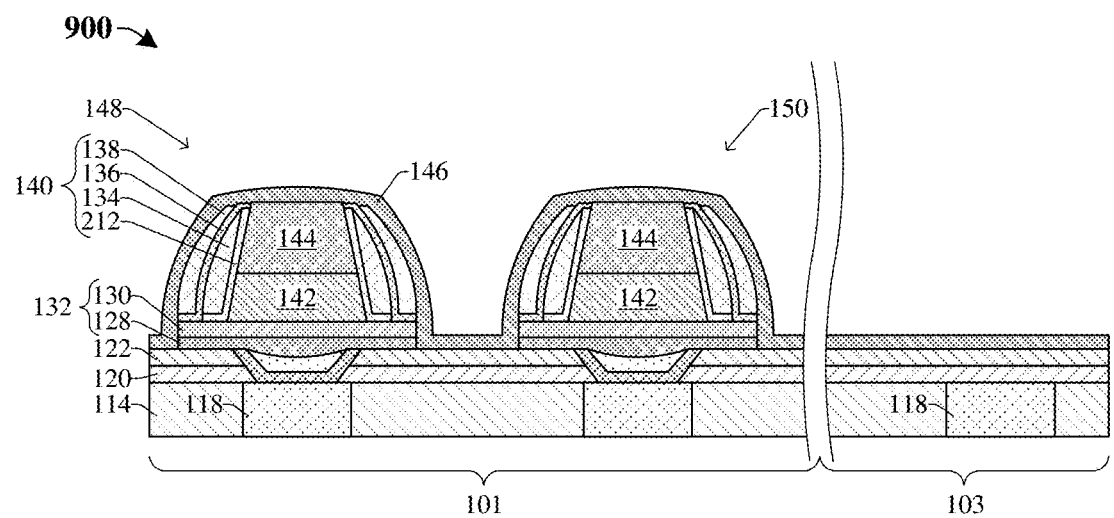

As shown in cross-sectional view 900 of FIG. 9, an outer sidewall spacer layer 146 is formed over the first and second MRAM cells 148, 150 and the second dielectric layer 122. In some embodiments, the outer sidewall spacer layer 146 may be deposited by, for example, plasma enhanced atomic layer deposition (PEALD).

Figure 10:
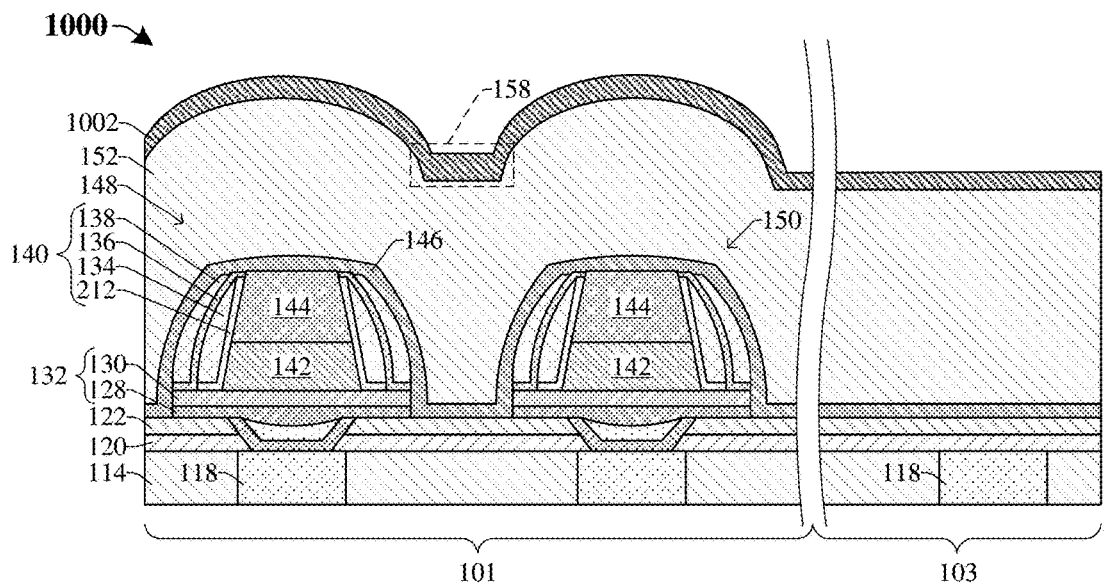

As shown in cross-sectional view 1000 of FIG. 10, an upper inter-level dielectric (ILD) layer 152 is formed over the first and second MRAM cells 148, 150 and a first dielectric protection layer 1002 is formed over the upper ILD layer 152. In some embodiments, the upper ILD layer 152 may, for example, be or comprise a low-K dielectric material, or another suitable dielectric material and/or may be formed to a thickness of about 1625 Angstroms or within a range of about 1,500 to 1,750 Angstroms. In further embodiments, the first dielectric protection layer 1002 may, for example, be or comprise an extreme low-K dielectric material, silicon nitride, silicon carbide, another suitable dielectric material, or the like and/or may be formed to a thickness of about 100 Angstroms or within a range of about 75 to 125 Angstroms. In some embodiments, the upper ILD layer 152 and/or the first dielectric protection layer 1002 may, for example, be deposited by PVD, CVD, ALD, or another suitable deposition process. In some embodiments, while forming the upper ILD layer 152, a trench 158 may be defined between the first and second MRAM cells 148, 150. In some embodiments, the first dielectric protection layer 1002 fills the trench 158.

Figure 11A:
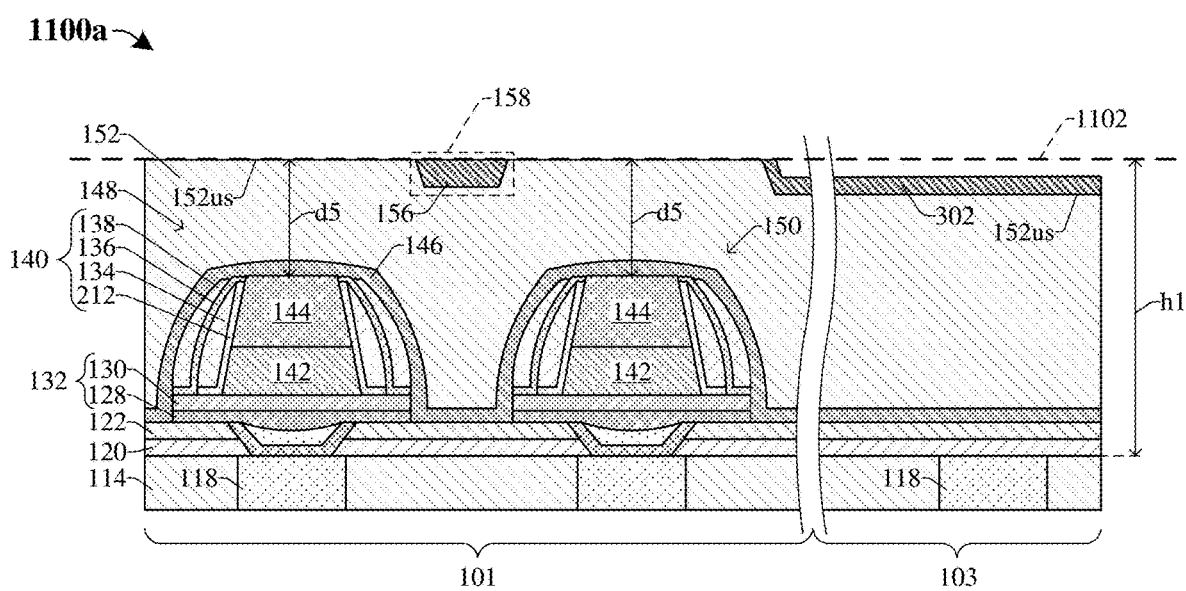

As shown in cross-sectional view 1100a of FIG. 11A, a planarization process (e.g., a chemical mechanical planarization (CMP) process) is performed on the upper ILD layer 152 and the first dielectric protection layer (1002 of FIG. 10), thereby defining a first dielectric protection layer 156 and a second dielectric protection layer 302. The first dielectric protection layer (1002 of FIG. 10) is configured to protect the upper ILD layer 152 from damage during the planarization process. In some embodiments, the second dielectric protection layer 302 is within a range of about 0 to 50 Angstroms. In yet further embodiments, the planarization process is configured to completely remove the first dielectric protection layer (1002 of FIG. 10), such that the second dielectric protection layer 302 is omitted (see FIG. 11B). Further, after the planarization process, the first dielectric protection layer 156 remains in the trench 158 between the first and second MRAM cells 148, 150.

In some embodiments, the planarization process is configured to ensure the upper ILD layer 152 has a substantially flat upper surface (e.g., a flat upper surface within a tolerance of a CMP process). For example, in some embodiments, at any point a height of the upper surface 152us of the upper ILD layer 152 varies within a range of −25 Angstroms and +25 Angstroms from a level horizontal line 1102 disposed along a top surface of the first dielectric protection layer 156. In other embodiments, at any point a height of the upper surface 152us of the upper ILD layer 152 varies within a range of −5 Angstroms and +5 Angstroms from the level horizontal line 1102. In yet other embodiments, at any point a height of the upper surface 152us of the upper ILD layer 152 varies within a range of approximately +10% and −10% of a thickness of the upper ILD layer 152 from the level horizontal line 1102.

In some embodiments, the planarization process is configured to define a height h1 that is defined between an upper surface of the upper ILD layer 152 and an upper surface of the lower ILD layer 114. In further embodiments, the height h1 is about 2,000 Angstroms or within a range of about 1,500 to 2,500 Angstroms. Further, the planarization process defines a distance d5 between an upper surface of the top electrode 144 and the upper surface of the upper ILD layer 152. In some embodiments, the distance d5 is within a range of about 300 to 700 Angstroms. In further embodiments, if the distance d5 is less than 300 Angstroms, then there may be insufficient space over the top electrode 144 to properly from overlying conductive layers. In yet further embodiments, if the distance d5 is greater than 700 Angstroms, then a gap may occur between a conductive layer formed over the top electrode 144 and the top electrode 144, such that the top electrode 144 is electrically isolated from the conductive layer.

Figure 11B:
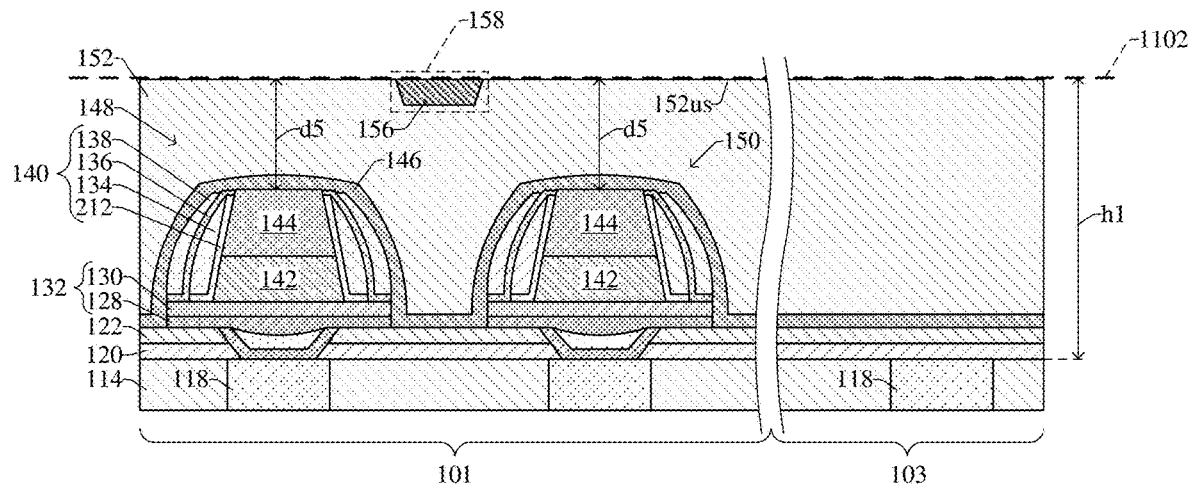

FIG. 11B illustrates a cross-sectional view 1100b of some alternative embodiments of the cross-sectional view 1100a of FIG. 11A. As shown in FIG. 11B, a planarization process (e.g., a CMP process) is performed on the upper ILD layer 152 and the first dielectric protection layer (1002 of FIG. 10), thereby defining a first dielectric protection layer 156. In some embodiments, a duration of the planarization process is controlled in such a manner to ensure the first dielectric protection layer (1002 of FIG. 10) is completely removed from the logic region 103. In some embodiments, an upper surface 152us of the upper ILD layer 152 and an upper surface of the first dielectric protection layer 156 are respectively disposed along the level horizontal line 1102. In some embodiments, the level horizontal line 1102 is parallel to an upper surface of the lower ILD layer 114.

Figure 12:
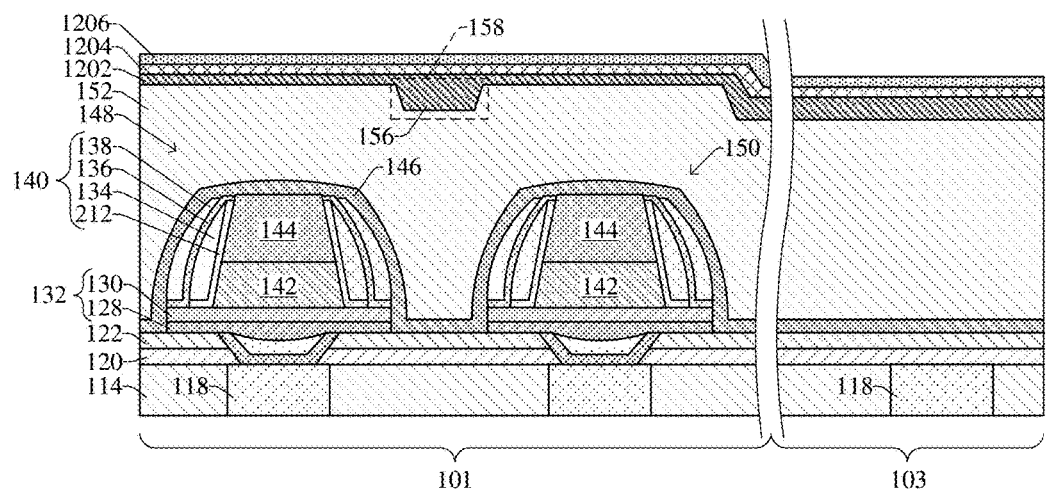

In some embodiments, the method may flow from FIG. 11A to FIG. 12 and in an alternative embodiment the method may flow from FIG. 11B to FIG. 12.

As shown in cross-sectional view 1200 of FIG. 12, a second dielectric protection structure 1202 is formed over the upper ILD layer 152. A second dielectric protection structure 1204 is formed over the second dielectric protection structure 1202. A masking layer 1206 is formed over the second dielectric protection structure 1204. In some embodiments, the second dielectric protection structure 1202 comprises a same material as the first dielectric protection layer 156 and/or is formed to a thickness of about 100 Angstroms. In some embodiments, the second dielectric protection structure 1204 is a nitrogen free anti-reflective (NFARC) layer comprising a silicon oxide layer having a thickness in a range of between about 150 to 250 Angstroms. In further embodiments, the masking layer 1206 may, for example, be or comprise titanium nitride, tantalum nitride, or the like and/or may be formed to a thickness of about 350 Angstroms. In some embodiments, the second dielectric protection structure 1202, the second dielectric protection structure 1204, and/or the masking layer 1206 may, for example, be deposited by CVD, PVD, ALD, or another suitable deposition or growth process.

Figure 13:
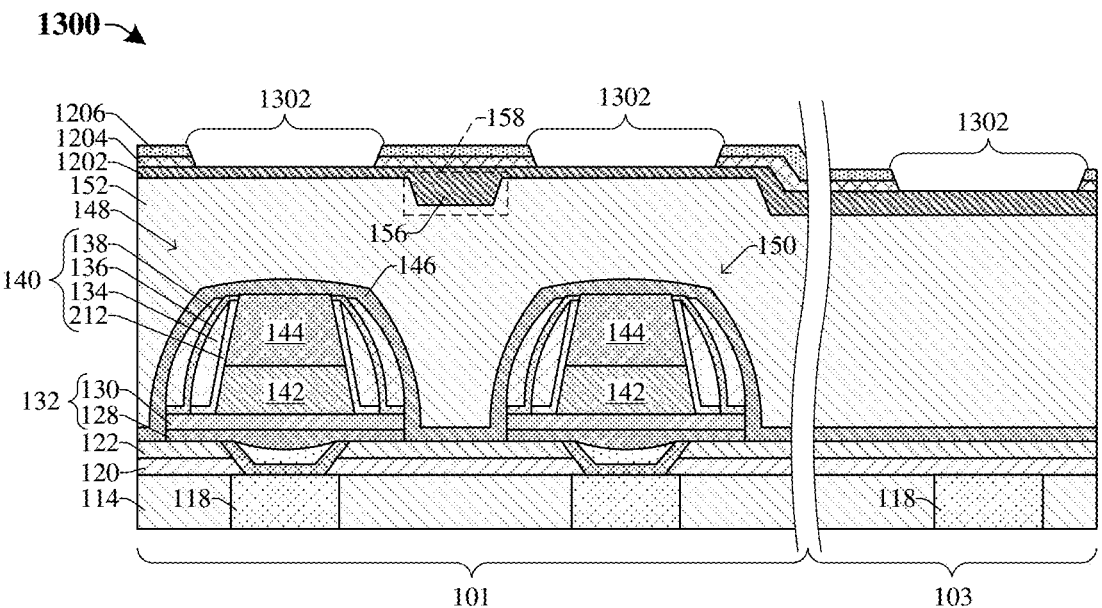

As shown in cross-sectional view 1300 of FIG. 13, a patterning process is performed on the masking layer 1206 and the second dielectric protection structure 1204, thereby defining a plurality of openings 1302.

Figure 14:
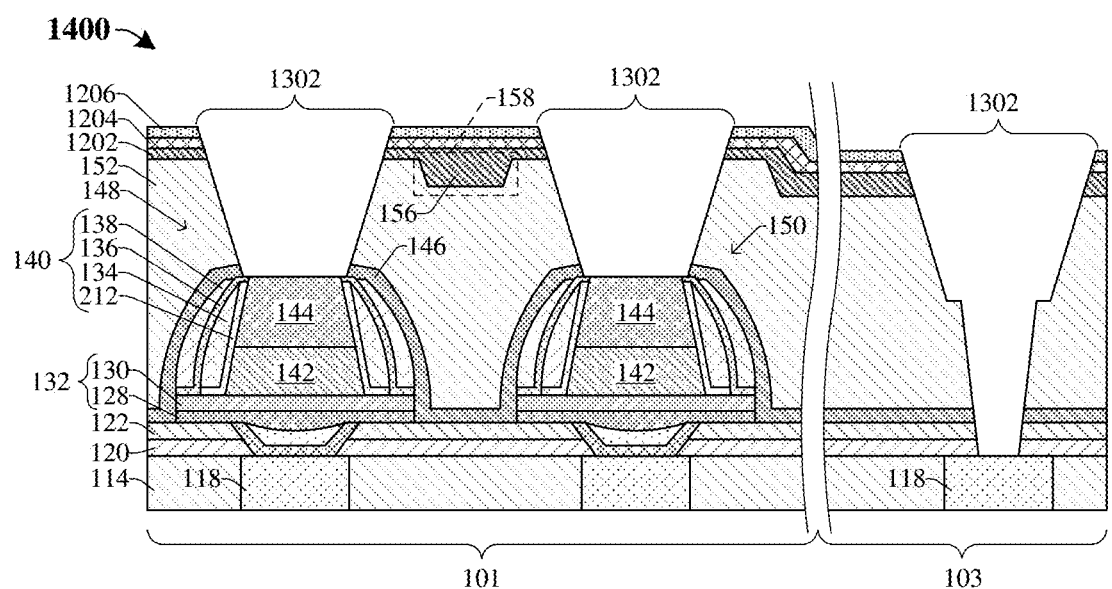

As shown in cross-sectional view 1400 of FIG. 14, a patterning process is performed on the structure of FIG. 13, thereby expanding the plurality of openings 1302. In some embodiments, the patterning process includes performing one or more etch processes and exposing unmasked regions of layers underlying the masking layer 1206 to one or more etchants. The one or more etch processes may include performing a first dry etch process into the second dielectric protection structure 1202 and the upper ILD layer 152 until an upper surface of the outer sidewall spacer layer 146 is reached. In such embodiments, the outer sidewall spacer layer 146 may not be etched by the first dry etch process. The one or more etch processes may further include performing a second dry etch process (e.g., a linear remove removal (LMR)) to remove at least a portion of the outer sidewall spacer layer 146 and expose the upper surface of the top electrode 144. In some embodiments, the second dry etch process may utilizes one or more etchants, such as, for example, carbon fluoride (e.g., $C_4F_8$), argon (Ar), oxygen ($O_2$), a combination of the foregoing, or the like. In some embodiments, the second dry etch process may etch the outer sidewall spacer layer 146 at a rate at least 5 times faster than the protection sidewall spacer layer 136 is etched during the second dry etch process.

In some embodiments, because the protective sidewall spacer layer 136 has a lower etching than adjacent layers and/or structures (e.g., the outer sidewall spacer layer 146), the protective sidewall spacer layer 136 continuously surrounds and/or directly contacts outer sidewalls of the top electrode 144 after the patterning process. This, in part, ensures the protective sidewall spacer layer 136 persists during an over etching period and continues to protect sidewalls of the top electrode 144 and the MTJ structure 142, thereby preventing damage to the MTJ structure 142 during the patterning process and during subsequent processing steps.

Figure 15:
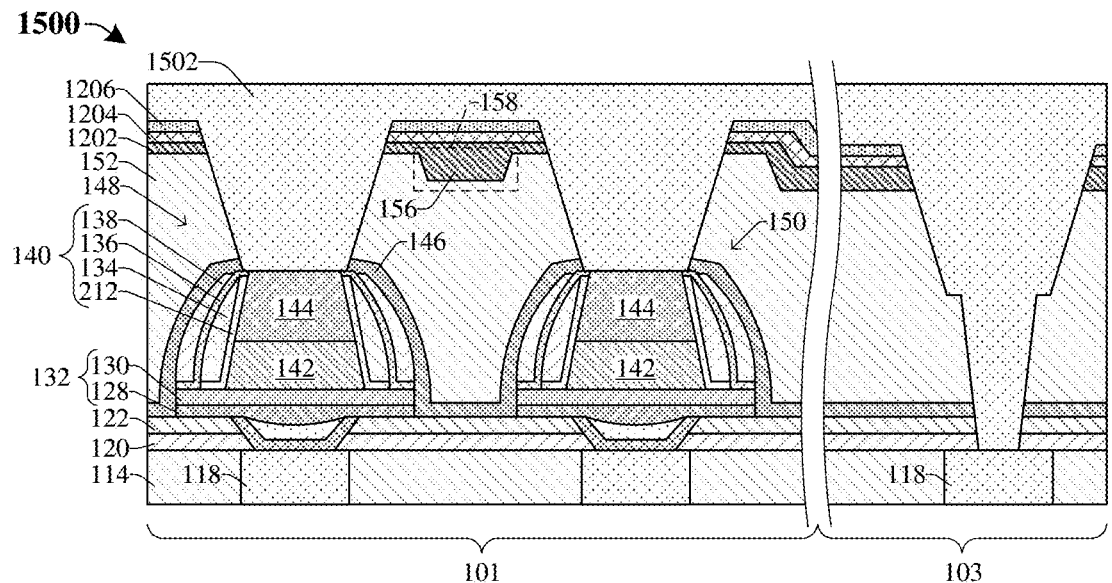

As shown in cross-sectional view 1500 of FIG. 15, a conductive structure 1502 is formed in the plurality of openings (1302 of FIG. 14). In some embodiments, the conductive structure 1502 may, for example, be or comprise aluminum, copper, tantalum, titanium, a combination of the foregoing, or the like. In further embodiments, the conductive structure 1502 may, for example, be deposited by CVD, PVD, sputtering, electroless plating, or another suitable growth or deposition process.

Figure 16:
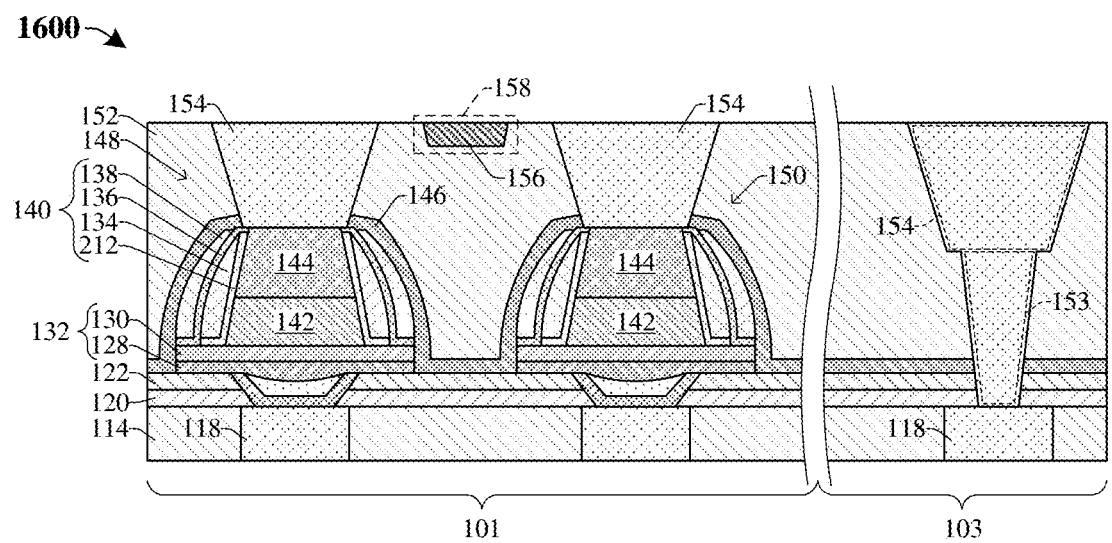

As shown in cross-sectional view 1600 of FIG. 16, a planarization process (e.g., a CMP process) is performed on the conductive structure 1502, thereby defining upper conductive wires 154 and a conductive via 153. In some embodiments, the planarization process is performed until an upper surface of the upper ILD layer 152 is reached.

Figure 17:
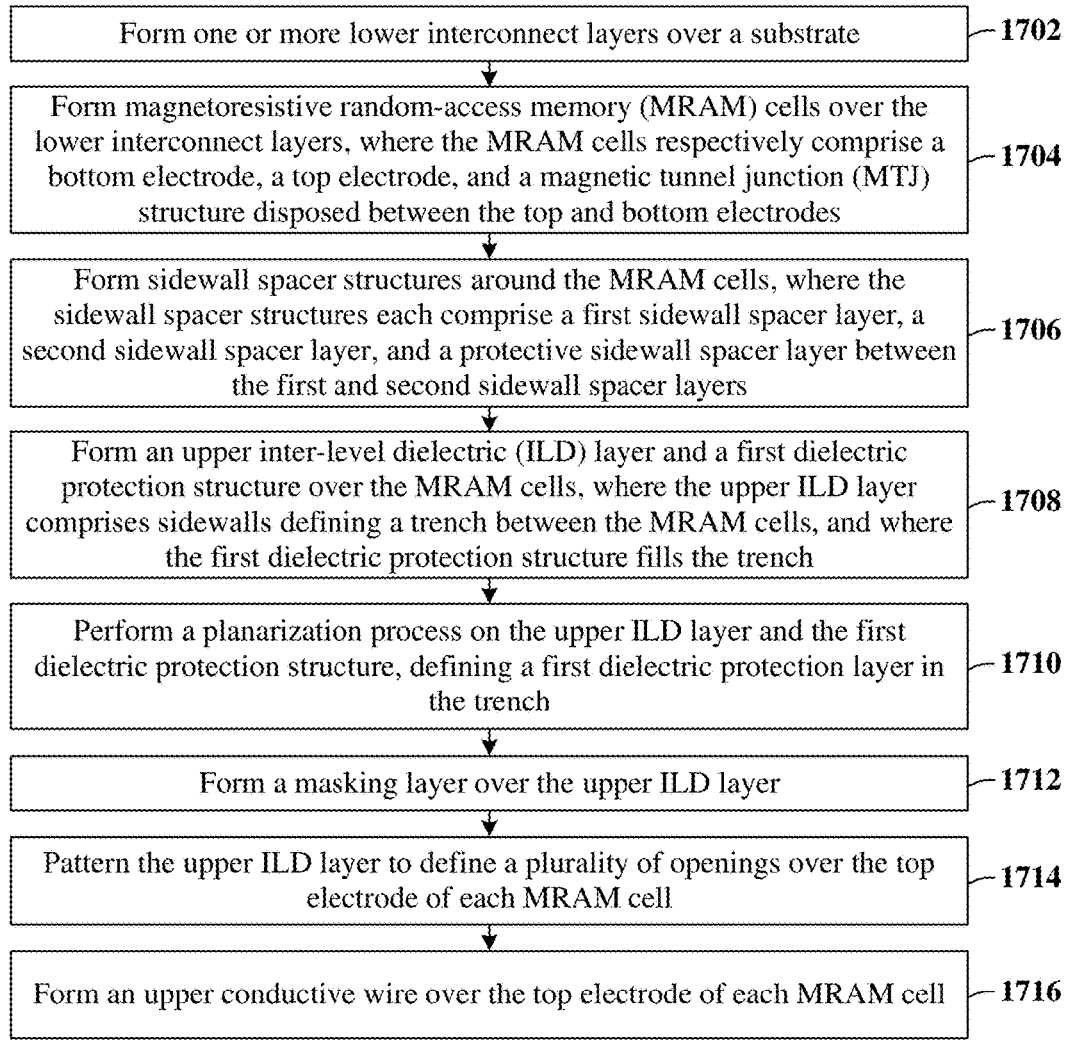
FIG. 17 illustrates a flowchart of some embodiments of a method of forming a memory device having MRAM cells respectively comprising a protective sidewall spacer layer laterally surrounding an MTJ and a top electrode contacting an overlying conductive wire.

FIG. 17 illustrates a flow diagram of some embodiments of a method 1700 of forming a memory device having MRAM cells respectively comprising a protective sidewall spacer layer laterally surrounding an MTJ and a top electrode contacting an overlying conductive wire. While the method 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, one or more lower interconnect layers are formed over a substrate. FIG. 6 illustrates a cross-sectional view 600 of some embodiments corresponding to act 1702.

At act 1704, magnetoresistive random-access memory (MRAM) cells are formed over the lower interconnect layers. The MRAM cells respectively comprise a bottom electrode, a top electrode, and a magnetic tunnel junction (MTJ) structure disposed between the top and bottom electrodes. FIGS. 6-8 illustrate cross-sectional views 600-800 of some embodiments corresponding to act 1704.

At act 1706, sidewall spacer structures are formed around the MRAM cells. The sidewall spacer structures each comprise a first sidewall spacer layer, a second sidewall spacer layer, and a protective sidewall spacer layer between the first and second sidewall spacer layers. FIGS. 7 and 8 illustrate cross-sectional views 700 and 800 of some embodiments corresponding to act 1706.

At act 1708, an upper inter-level dielectric (ILD) layer and a first dielectric protection layer are formed over the MRAM cells. The upper ILD layer comprises sidewalls defining a trench between the MRAM cells, where the first dielectric protection layer fills the trench. FIG. 10 illustrates a cross-sectional view 1000 of some embodiments corresponding to act 1708.

At act 1710, a planarization process is performed on the upper ILD layer and the first dielectric protection layer, defining a first dielectric protection layer in the trench. FIG. 11A illustrates cross-sectional view 1100a of some embodiments corresponding to act 1710 and FIG. 11B illustrates cross-sectional view 1100b of alternative embodiments corresponding to act 1710.

At act 1712, a masking layer is formed over the upper ILD layer. FIGS. 12 and 13 illustrate cross-sectional views 1200 and 1300 of some embodiments corresponding to act 1712.

At act 1714, the upper ILD layer is patterned to define a plurality of openings over the top electrode of each MRAM cell. FIG. 14 illustrates cross-sectional view 1400 of some embodiments corresponding to act 1714.

At act 1716, an upper conductive wire is formed over the top electrode of each MRAM cell. FIGS. 15 and 16 illustrate cross-sectional views 1500 and 1600 of some embodiments corresponding to act 1716.

Accordingly, in some embodiments, the present disclosure relates to a method for forming a memory device including an MRAM cell having a protective sidewall spacer layer disposed within an embedded memory region and a lower interconnect wire disposed within a logic region. The method includes forming a dielectric structure over the MRAM cell and the lower interconnect wire, and subsequently performing a single etch process according to a single masking layer to expose an upper surface of the MRAM cell and an upper surface of the lower interconnect wire.

In some embodiments, the present application provides a memory device, including an upper inter-level dielectric (ILD) layer overlying a substrate; a first memory cell disposed within the upper ILD layer, wherein the first memory cell includes a top electrode, a bottom electrode, and a magnetic tunnel junction (MTJ) structure disposed between the top and bottom electrodes; a sidewall spacer structure laterally surrounding the first memory cell, wherein the sidewall spacer structure includes a first sidewall spacer layer, a second sidewall spacer layer, and a protective sidewall spacer layer disposed between the first and second sidewall spacer layers, wherein the first and second sidewall spacer layers comprise a first material and the protective sidewall spacer layer comprises a second material different than the first material; and a conductive wire overlying the first memory cell, wherein the conductive wire contacts the top electrode and the protective sidewall spacer layer.

In some embodiments, the present application provides a memory device including a first magnetoresistive random-access memory (MRAM) cell overlying a substrate and disposed within an embedded memory region, wherein the embedded memory region is adjacent to a logic region; a second MRAM cell overlying the substrate, wherein the first and second MRAM cells respectively include a top electrode, a bottom electrode, and a magnetic tunnel junction (MTJ) structure disposed between the top and bottom electrodes; an upper inter-level dielectric (ILD) layer overlying the first and second MRAM cells, wherein the upper ILD layer comprises sidewalls defining a trench between the first and second MRAM cells, wherein the upper ILD layer comprises a first material; a first dielectric protection layer disposed within the trench and comprising a second material different from the first material, wherein the first dielectric protection layer is laterally offset from the logic region by a non-zero distance; sidewall spacer structures laterally enclosing the first and second MRAM cells, respectively, wherein the sidewall spacer structures comprise a protective sidewall spacer layer disposed between a first sidewall spacer layer and a second sidewall spacer layer; and conductive wires overlying the first and second MRAM cells, wherein a first conductive wire directly contacts a top surface of the first MRAM cell and a second conductive wire directly contacts a top surface of the second MRAM cell.

In some embodiments, the present application provides a method of forming a memory device, the method includes forming a first magnetoresistive random-access memory (MRAM) cell over a substrate; forming a second MRAM cell over the substrate; forming sidewall spacer structures around the first and second MRAM cells, respectively, wherein the sidewall spacer structures comprise a first sidewall spacer layer, a second sidewall spacer layer, and a protective sidewall spacer layer sandwiched between the first and second sidewall spacer layers, respectively; forming an upper inter-level dielectric (ILD) layer over the first and second MRAM cells, wherein the upper ILD layer comprises sidewalls defining a trench spaced laterally between the first and second MRAM cells; forming a dielectric protection layer over the upper ILD layer, wherein the dielectric protection layer fills the trench; performing a first planarization process on the upper ILD layer and the dielectric protection layer, wherein the dielectric protection layer remains in the trench after the first planarization process; and forming conductive wires over the first and second MRAM cells, wherein the conductive wires directly contact a top electrode of the first and second MRAM cells, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a memory cell overlying a substrate and comprising a top electrode;
a sidewall spacer structure disposed along sidewalls of the memory cell, wherein the sidewall spacer structure comprises a first spacer layer on the memory cell, a second spacer layer around the first spacer layer, and a third spacer layer around the second spacer layer, wherein the second spacer layer comprises a lateral segment adjacent to a vertical segment, wherein the lateral segment abuts the top electrode and has a top surface aligned with or disposed below a top surface of the top electrode; and
a first conductive structure overlying the memory cell and contacting the lateral segment and the top electrode.

2. The integrated chip of claim 1, wherein the vertical segment is curved and laterally offset from the top electrode by the lateral segment.

3. The integrated chip of claim 2, wherein a height of the lateral segment is equal to a distance between a top surface of the first spacer layer and a lower surface of the first conductive structure.

4. The integrated chip of claim 1, wherein the third spacer layer extends over at least a portion of the top surface of the lateral segment and contacts an outer sidewall of the second spacer layer.

5. The integrated chip of claim 1, further comprising:
a dielectric structure overlying the memory cell, wherein the first conductive structure is disposed in the dielectric structure, wherein the dielectric structure comprises sidewalls defining a trench laterally offset from the first conductive structure, wherein a dielectric layer is disposed in the trench.

6. The integrated chip of claim 5, wherein in a cross-sectional view the dielectric layer has slanted sidewalls and in a top view the dielectric layer has at least one curved side.

7. The integrated chip of claim 1, further comprising:
a second conductive structure laterally offset from the first conductive structure, wherein top surfaces of the first and second conductive structures are aligned, and wherein a bottom surface of the second conductive structure is below a top surface of the first spacer layer.

8. The integrated chip of claim 7, wherein a bottom surface of the first conductive structure is above the top surface of the first spacer layer.

9. An integrated chip, comprising:
a first memory cell overlying a substrate;
a second memory cell overlying the substrate and laterally offset from the first memory cell, wherein the first and second memory cells respectively comprise a top electrode over a data storage structure;
a third memory cell overlying the substrate and laterally offset from the first memory cell in a first direction and laterally offset from the second memory cell in a second direction substantially orthogonal to the first direction;
a first dielectric layer overlying the first and second memory cells, wherein the first dielectric layer comprises opposing sidewalls defining a trench spaced between the first and second memory cells, wherein the first dielectric layer comprises a first material;
a second dielectric layer disposed in the trench and contacting the opposing sidewalls, wherein the second dielectric layer comprises a second material different from the first material, wherein the second dielectric layer is laterally offset from a first region directly between the first memory cell and the third memory cell and from a second region directly between the second memory cell and the third memory cell; and
a protective sidewall spacer disposed around the first and second memory cells, wherein the protective sidewall spacer contacts a sidewall of the top electrode of the first memory cell, and wherein a thickness of the protective sidewall spacer is less than a thickness of the second dielectric layer.

10. The integrated chip of claim 9, further comprising:
a plurality of conductive structures disposed in the first dielectric layer and overlying the first and second memory cells, wherein top surfaces of the conductive structures are coplanar with a top surface of the second dielectric layer.

11. The integrated chip of claim 10, wherein the second dielectric layer is laterally offset from the plurality of conductive structures.

12. The integrated chip of claim 10, wherein a lateral distance between the second dielectric layer and an individual conductive structure in the plurality of conductive structures is less than a distance between the opposing sidewalls.

13. The integrated chip of claim 10, wherein a bottom surface of an individual conductive structure in the plurality of conductive structures is below a top surface of the protective sidewall spacer.

14. The integrated chip of claim 9, wherein the protective sidewall spacer is more resistance to etching than the first dielectric layer.

15. The integrated chip of claim 9, further comprising:
a sidewall spacer layer over and around the protective sidewall spacer, wherein the sidewall spacer layer extends along a lateral distance between the first and second memory cells, wherein the sidewall spacer layer comprises a different material from that of the protective sidewall spacer.

16. An integrated chip, comprising:
a memory cell overlying a substrate and comprising a top electrode;
a first sidewall spacer disposed on a sidewall of the top electrode;
a second sidewall spacer disposed on the first sidewall spacer;
a protective sidewall spacer disposed between the first and second sidewall spacer, wherein the protective sidewall spacer contacts the sidewall of the top electrode and has a lower surface disposed along a top surface of the first sidewall spacer, wherein a first distance between the lower surface of the protective sidewall spacer and a bottom surface of the top electrode is greater than a second distance between the top surface of the first sidewall spacer and a top surface of the top electrode; and
a conductive structure over the top electrode and having a bottom surface directly contacting the top surface of the top electrode and a top surface of the protective sidewall spacer, wherein the second sidewall spacer is disposed along opposing sidewalls of the conductive structure.

17. The integrated chip of claim 16, wherein the protective sidewall spacer directly contacts the sidewall of the top electrode along a vertical distance that is less than the first distance.

18. The integrated chip of claim 16, further comprising:
a first dielectric layer over the memory cell and around the second sidewall spacer, wherein the protective sidewall spacer is configured to be more resistance to etching than the first dielectric layer.

19. The integrated chip of claim 16, wherein the first and second sidewall spacers comprise a nitride or a carbide.

20. The integrated chip of claim 19, wherein the protective sidewall spacer comprises a metal oxide.

* * * * *